United States Patent [19]

Martin

[11] Patent Number: 5,224,017
[45] Date of Patent: Jun. 29, 1993

[54] COMPOSITE HEAT TRANSFER DEVICE

[75] Inventor: Jacob H. Martin, Wellesley, Mass.

[73] Assignee: The Charles Stark Draper Laboratory, Inc., Cambridge, Mass.

[21] Appl. No.: 879,152

[22] Filed: Apr. 30, 1992

Related U.S. Application Data

[63] Continuation of Ser. No. 683,094, Apr. 10, 1991, abandoned, which is a continuation of Ser. No. 353,086, May 17, 1989, abandoned.

[51] Int. Cl.⁵ .............................................. H05K 7/20
[52] U.S. Cl. .................................. 361/388; 165/185; 174/252; 174/257; 427/96; 428/408; 428/901
[58] Field of Search ................ 165/185, 905, 802; 174/16.3, 252, 256, 257; 156/253; 357/74, 80–82; 427/96; 428/406, 408, 457, 461, 901, 902; 361/383–385, 400, 403, 412, 414

[56] References Cited

U.S. PATENT DOCUMENTS

| | | | |
|---|---|---|---|
| 4,109,377 | 8/1978 | Blazick | 29/626 |
| 4,513,055 | 4/1985 | Leibowitz | 174/256 |
| 4,591,659 | 3/1986 | Leibowitz | 174/256 |
| 4,689,110 | 8/1987 | Leibowitz | 174/252 |
| 4,788,627 | 11/1988 | Ehlert | 361/386 |
| 4,812,792 | 3/1989 | Leibowitz | 361/387 |
| 4,814,945 | 3/1989 | Leibowitz | 174/256 |
| 4,847,731 | 7/1989 | Smolley | 361/385 |
| 4,867,235 | 9/1989 | Grapes | 361/388 |
| 4,876,120 | 10/1989 | Belke | 174/256 |
| 4,878,152 | 10/1989 | Sauzade | 174/252 |
| 4,882,454 | 11/1989 | Peterson | 174/252 |
| 4,888,247 | 12/1989 | Zweben | 428/902 |
| 4,935,285 | 6/1990 | Toda | 428/137 |
| 5,045,141 | 9/1991 | Salensky | 156/240 |

Primary Examiner—Gerald P. Tolin
Attorney, Agent, or Firm—Iandiorio & Dingman

[57] ABSTRACT

A composite heat transfer device is disclosed, for mounting with an object having a predetermined coefficient of thermal expansion, including a composite heat conductive member having a quantity of first and second materials; the first material having a positive coefficient of thermal expansion and the second material having a negative coefficient of thermal expansion. The first and second materials are combined in a quantity ratio to produce a composite heat transfer device with a coefficient of thermal expansion which can be closely tailored to match the predetermined coefficient of thermal expansion of the object with which heat is to be transferred. Also included is a heat transfer assembly including a circuit board on which are located a plurality of heat generating devices. The circuit board is mounted proximate a composite heat conductive member. The composite heat conductive member is mounted proximate a hollow core structure which forms passageways through which may flow a fluid medium. The fluid medium serves to transfer heat from the heat conductive member.

3 Claims, 1 Drawing Sheet

COMPOSITE HEAT TRANSFER DEVICE

This is a continuation of application Ser. No. 07/683,094 filed Apr. 10, 1991, now abandoned, which is a continuation of application Ser. No. 07/353,086, filed May 17, 1989 now abandoned.

FIELD OF INVENTION

This invention relates to a composite heat transfer device whose coefficient of thermal expansion is tailored to that of an adjacent heat generating device, and more particularly, to such a composite heat transfer device made of a composite of materials having negative and positive coefficients of thermal expansion.

BACKGROUND OF INVENTION

Continued development of physically larger and higher power integrated circuits is focusing much attention on the need for maintaining the operating temperature of the circuits at a point where the reliability of the circuit is at an acceptable level. The higher operating temperatures of the electronics has increased attention on the thermal expansion mismatch between the heat sink the circuit wiring board and the heat dissipating components mounted proximate the circuit wiring board. The large mismatch in thermal expansion coefficients between electronic components, circuit boards and heatsinks is responsible for fatigue stress, and subsequent fatigue failure of solder joints, a common cause of failure in surface mount assemblies. Due to these stress and fatigue problems, the use of surface mount technology has not proceeded nearly as rapidly as anticipated.

Previous attempts at solving these problems have been only partially successful. The prior art solutions include laminating a circuit board to a heatsink comprising a copper/Invar/copper laminate or copper/molybdenum/copper laminate. The thickness of the various materials, their Young's moduli, and their individual thermal expansion coefficients determine the coefficient of thermal expansion of the circuit board/heatsink combination.

Unfortunately, this approach suffers from many problems. First, the copper/Invar/copper laminate and the copper/molybdenum/copper laminate are quite heavy. In fact, these materials weigh almost three times as much as aluminum. In many aerospace applications, excess weight translates into thousands of dollars in added costs.

Second, these heatsinks have thermal coefficients of expansion greater than that of silicon. Attempts at lowering the thermal coefficient of expansion of the copper/Invar/copper sandwich by adding a greater percentage of Invar to the laminate results in the entire composite becoming a relatively poor heatsink since Invar is not a good thermal conductor.

SUMMARY OF INVENTION

It is therefore an object of this invention to provide a heat transfer device in which the thermal coefficient of expansion of the heat transfer device can be controlled.

It is a further object of this invention to provide such a heat transfer device in which the thermal coefficient of expansion of the heat transfer device closely matches that of the device to be cooled such as a ceramic circuit board or a silicon based circuit board.

It is a further object of this invention to provide such a heat transfer device which is a good thermal conductor.

It is a still further object of this invention to provide a heat transfer device which is lightweight and minimizes fatigue stress in a circuit board's components and attachments to the circuit board.

It is a further object of this invention to provide such a heat transfer device which may be provided with a hollow core for weight reduction while maintaining stiffness.

It is a further object of this invention to provide such a heat transfer device which provides hollow passageways for ducting a fluid medium for additional heat transfer.

This invention results from the realization that a truly effective heat transfer device with a coefficient of thermal expansion closely matched to that of the circuit board or other device to be cooled, can be accomplished using a composite of materials having negative and positive coefficients of thermal expansion, whose combined coefficient of thermal expansion can be tailored to that of the device to be cooled.

This invention features a composite heat transfer device for mounting with an object having a predetermined coefficient of thermal expansion and includes a composite heat conductive member having a quantity of first and second materials; the first and second materials having a first and second coefficient of thermal expansion, respectively. The first and second materials are combined in a quantity ratio to produce a composite heat transfer device with a coefficient of thermal expansion which can be tailored to match the predetermined coefficient of thermal expansion of the object with which heat is to be transferred.

In a preferred embodiment, the first material has a positive coefficient of thermal expansion and includes a metal selected from the group consisting of aluminum, magnesium, titanium or copper. The second material has a negative coefficient of thermal expansion and is a carbon based material which may be in the form of carbon fibers, carbon powder, diamond dust, or graphite filaments woven into cloth. In addition, the first and second materials may be generally evenly distributed throughout the composite heat conductive member or symmetrically layered.

The composite heat transfer device may include a laminated composite heat conductive member including at least one layer each of the first and one layer of the second materials. The layers of the first and second materials are laminated together in a quantity ratio to provide a composite heat transfer device with a coefficient of thermal expansion which closely matches the predetermined coefficient of thermal expansion of an object mounted proximate the heat conductive member. The first material may include metal which may be in the form of powder. The second material may include carbon which may be in the form of a woven carbon cloth sheet. In addition, the first and second materials may be interposed between two layers of a third material. The third material may include metal foil which may be the same as the first material.

This invention also features a heat transfer device assembly for a circuit board including a plurality of electronic components. The assembly includes a circuit board having a first coefficient of thermal expansion and having a first surface including at least one heat generating source having a predetermined coefficient of thermal expansion; and a second surface from which heat is to be conducted. A composite heat conductive member is mounted proximate the second surface of the circuit board and includes a first material having a positive thermal coefficient of expansion and a second material having a negative coefficient of thermal expansion. The first and second materials combine together in a quantity ratio to produce a composite heat conductive member with a coefficient of thermal expansion which, when combined with the first coefficient of thermal expansion of said circuit board, matches the predetermined coefficient of thermal expansion of the heat generating source, such as the electronic circuit(s) mounted on the circuit board.

In a preferred embodiment, the first material includes a metal selected from the group including aluminum, magnesium, titanium or copper; while the second material includes carbon fibers. Mounted proximate the composite heat conductive member may be a hollow core structure including at least one chamber. The chamber is adapted for allowing the flow of a fluid medium through the chamber, to transfer heat to the fluid from the composite heat conductive member.

Further included are a second circuit board and a second composite heat conductive member mounted proximate the second circuit board. The first and second composite heat conductive members are connected by a hollow core structure adapted for providing hollow passageways for allowing the flow of a fluid medium to cool the heat conductive members and the circuit boards. The hollow core structure may include a corrugated or undulating shape and may also be made of a composite material.

DESCRIPTION OF PREFERRED EMBODIMENT

Other objects, features and advantages will occur from the following description of a preferred embodiment and the accompanying drawings, in which.

A composite heat transfer device according to this invention may be accomplished by providing a composite heat conductive member for mounting proximate an object with which heat is to be transferred. The object has a predetermined coefficient of thermal expansion. The composite heat conductive member includes first and second materials, having positive and negative coefficients of thermal expansion. The first and second materials are combined in a quantity ratio such that the resultant coefficient of thermal expansion of the composite heat conductive member closely matches that of the predetermined coefficient of thermal expansion of an object with which heat is to be transferred.

Figure 1:
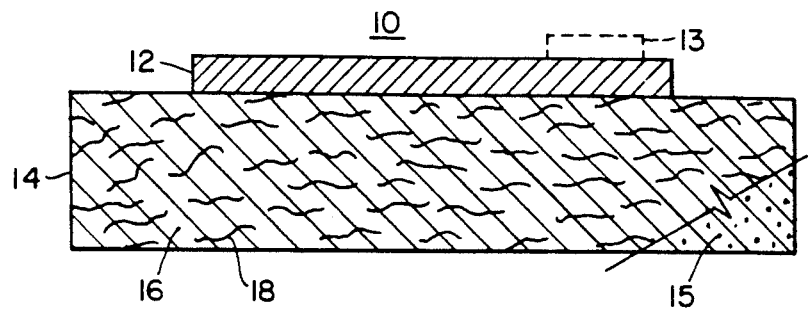
FIG. 1 is a schematic cross sectional view of a circuit board mounted to a composite heat transfer device according to the present invention.

There is shown in FIG. 1 heat transfer device 10, including object 12 to or from which heat is to be transferred, and having a predetermined coefficient of thermal expansion. Object 12 may be any object to or from which heat is to be transferred such as a circuit board having heat generating electronic components 13 mounted on one surface. Composite heat conductive member 14 is mounted proximate object 12 and includes first material 16 having a first coefficient of thermal expansion. Typically, first material 16 has a positive coefficient of thermal expansion and is a metal selected from the group consisting of aluminum, magnesium, titanium or copper. Mixed with first material 16 is second material 18 which is typically a carbon based material which may be in the form of carbon fibers. The carbon based material may also be in the form of carbon or graphite powder 15, diamond dust, graphite filaments or a woven carbon cloth. Carbon fibers 18 are generally evenly distributed throughout first material 16 in such a quantity ratio that the resultant coefficient of thermal expansion of the combination of first material 16 and carbon fibers 18 closely matches that of the predetermined coefficient of thermal expansion of object 12. For example, if object 12 is an alumina circuit board with electronic components mounted thereupon and having a thermal coefficient of expansion of $6 \times 10^{-6}/°C.$, heat conductive member 14 comprises approximately 60% of first metal material 16 and 40% of second carbon fiber material 18.

Alternatively, the quantity ratio of first and second materials that comprise composite heat conductive member 14 may be tailored such that the combined coefficients of thermal expansion of composite heat conductive member 14 and circuit board 12 closely matches the coefficient of thermal expansion of electronic component 13.

Various forms of carbon may be preferred with various forms of the first material. For example, chopped or powdered carbon or graphite may be mixed and sintered with aluminum metal flakes in such a ratio as to achieve a heat conductive member whose coefficient of thermal expansion is tailored to approximately match that of an adjacent heat generating device. Alternatively, layers of woven carbon cloth may be embedded in with metal powder or shavings and sintered to achieve the same results.

Figure 2:
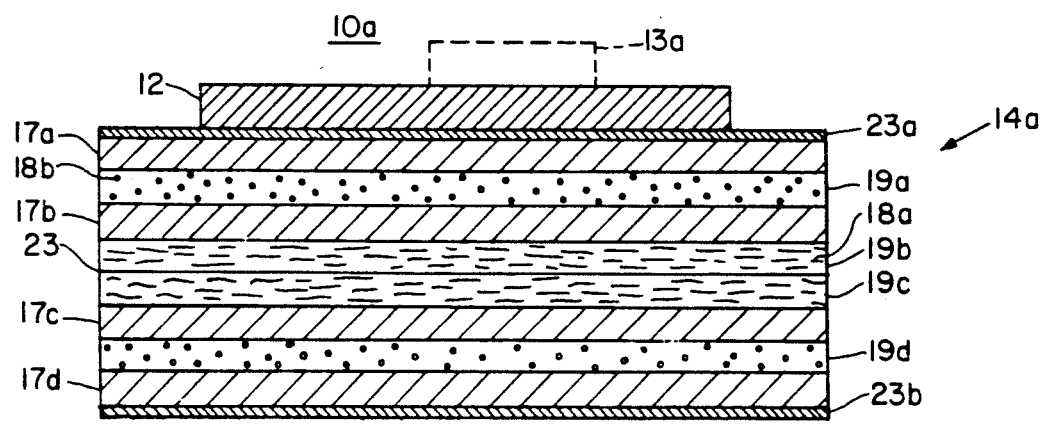
FIG. 2 is a cross sectional view of a multi-layered laminated composite heat transfer device.

A composite heat transfer device 10a, FIG. 2, according to this invention may include laminated heat conductive member 14a mounted proximate object 12 such as a circuit board on which is mounted electronic circuit 13a.

Laminated heat conductive member 14a includes alternating layers of first material 17a-17d and second material 19a-19d. First material 17a-17d includes metal or similar material having a positive coefficient of thermal expansion. The metal may include aluminum, magnesium, titanium or copper and may be in the form of a thin sheet, flakes or a powder. Second material layers 19a-19d are comprised of a carbon based material having a negative coefficient of thermal expansion, and typically are in the form of a woven carbon cloth or in the form of layers of unidirectional fibers as shown in FIG. 2. The alternating layers of first and second materials may be enclosed between two layers of third material 23a, 23b which are typically a metal foil layer and serve to enclose the laminated heat conductive member. The number of layers, thickness and material composition of first metal layers 17a-17d and second carbon layers 19a-19d are selected such that the combined coefficient of thermal expansion of laminated heat conductive member 14a, including third material layers 23a and 23b closely matches the predetermined coefficient of thermal expansion of object 12. In addition, since the carbon fibers are a crystalline based material with a predetermined orientation, it is important that the orientation of the carbon fiber layers be rotated 90° to minimize bending or warping of heat conductive member 14a. Most importantly, the laminate should be symmetrical about the center line of the laminate. This insures that the fiber direction is arranged so that the coefficient of thermal expansion in the planar direction of the heat-generating member is isotropic, to minimize laminate warpage when heated.

For example, carbon layers 19b and 19c may be oriented such that the longitudinal axis of fibers 18a are oriented parallel with the longitudinal axis of heat conductive member 14a; while the orientation of fibers 18b in carbon layers 19a and 19d are rotated 90° relative to central carbon layers 19b and 19c. Heat conductive member 14a should be symmetrical about center 23 of heat conductive member 14a to help insure that the member will not bend or warp. In addition, metal layers 23a and 23b may be approximately 0.001 to 0.0025 inches in thickness while the combination of one metal layer such as layer 17a and one carbon layer 19a may be 0.0045 to 0.005 inches in thickness. The overall thickness of heat conductive member 14a may be in the order of 0.020 inches.

Figure 3:
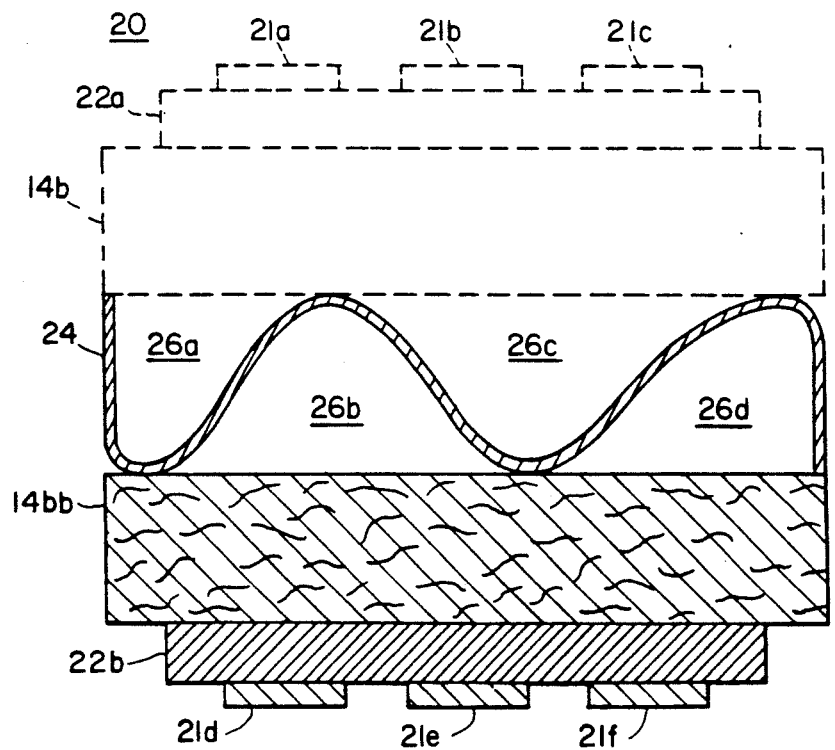
FIG. 3 is a schematic cross sectional view of a hollow core heat transfer device assembly including two circuit boards and two heat transfer devices according to the present invention.

In a preferred embodiment, composite heat transfer assembly 20, FIG. 3, includes composite heat conductive member 14bb which is mounted proximate printed circuit board 22b on which are mounted electronic components 21d–21f. In addition, there may be included second heat conductive member 14b and second printed circuit board 22a, on which are mounted electronic components 21a–21c. First heat conductive member 14b and second heat conductive member 14bb are connected yet separated by hollow core structure 24, which may be in the form of an undulating shape or any other open structure. The hollow core structure 24 provides stiffness which will minimize flexing under vibration and shock. In addition, hollow core structure 24 creates passageways 26a–26d through which may flow air, a liquid coolant, or other fluid medium which serves to transfer heat to or from composite heat conductive members 14b, 14bb and circuit boards 22a, 22b mounted thereupon. Hollow core structure 24 may be fabricated from conventional materials or from a composite material similar to that of heat conductive members 14b and 14bb.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A composite heat transfer assembly including at least first and second circuit boards on which are mounted a plurality of electronic components, the electronic components having a predetermined coefficient of thermal expansion, comprising:
   said first and second circuit boards having a first coefficient of thermal expansion;
   said first and second circuit boards each including a first surface on which is disposed at least one heat generating electronic component having a predetermined coefficient of thermal expansion, and a second surface from which heat is to be transferred;
   first and second composite heat conductive members, mounted proximate the second surfaces of said first and second circuit boards, and including a first material having a positive coefficient of thermal expansion, and a second material being of particulate form and having a negative coefficient of thermal expansion;
   said second material being mixed with and generally evenly distributed throughout said first material, in a quantity ratio to produce first and second composite heat conductive members each with a coefficient of thermal expansion which, when combined with said first coefficient of thermal expansion of the corresponding circuit board, closely matches said predetermined coefficient of thermal expansion of said heat generating electronic components mounted on the corresponding circuit board; and
   said first and second composite heat conductive members being connected by a hollow core structure adapted for allowing the flow of a fluid medium through the hollow core, to transfer heat between said first and second composite heat conductive members and said fluid medium.

2. A composite heat transfer assembly with a circuit board including a plurality of heat generating sources, said heat generating sources having a predetermined coefficient of thermal expansion, comprising:
   said circuit board having a first coefficient of thermal expansion, comprising:
   said circuit board including a first surface proximate at least one of said heat generating sources having a predetermined coefficient of thermal expansion, and a second surface from which heat is to be transferred;
   a composite heat conductive member, mounted proximate the second surface of said circuit board and including a first material having a positive coefficient of thermal expansion, and a second material being of particulate form and having a negative coefficient of thermal expansion;
   said first and second materials generally evenly distributed throughout said composite heat conductive member in a quantity ratio to produce a composite heat conductive member with a coefficient of thermal expansion which, when combined with said first coefficient of thermal expansion of said circuit board, closely matches said predetermined coefficient of thermal expansion of said heat generating sources; and
   a hollow core structure mounted proximate said composite heat conductive member and including at least one chamber adapted for allowing the flow of a fluid medium through said chamber to transfer heat with said composite heat conductive member and said fluid medium wherein said hollow core structure includes an undulating shape.

3. A composite heat transfer assembly including first and second circuit boards on which are mounted a plurality of heat generating sources, said heat generating sources having a predetermined coefficient of thermal expansion, comprising:
   said first and second circuit boards having a first coefficient of thermal expansion;
   said first and second circuit boards each including a first surface proximate at least one of said heat generating sources having a predetermined coefficient or thermal expansion, and a second surface from which heat is to be transferred;
   first and second composite heat conductive members, mounted proximate the second surfaces of said first and second circuit boards and including a first material having a positive coefficient of thermal expansion, and a second material being of particulate form and having a negative coefficient of thermal expansion;

said first and second materials generally evenly distributed throughout said composite heat conductive member in a quantity ratio to produce first and second composite heat conductive members with a coefficient of thermal expansion which, when combined with said first coefficient of thermal expansion of said circuit boards, closely matches said predetermined coefficient of thermal expansion of said heat generating sources; and a hollow core structure connected to said first and second heat conductive members, including at least one chamber, and adapted for allowing the flow of a fluid medium through the chamber of said hollow core structure to transfer heat with said first and second composite heat conductive members and said fluid medium, wherein said hollow core structure includes an undulating shape.

* * * * *